United States Patent
Lundberg et al.

(10) Patent No.: US 8,627,558 B2
(45) Date of Patent: Jan. 14, 2014

(54) PRODUCTION LINE AND METHOD FOR OPERATING SUCH

(75) Inventors: Ivan Lundberg, Västerås (SE); Mats Källman, Västerås (SE); Sönke Kock, Västerås (SE)

(73) Assignee: ABB Research Ltd. (CH)

( * ) Notice: Subject to any disclaimer, the term of this patent is extended or adjusted under 35 U.S.C. 154(b) by 389 days.

(21) Appl. No.: 12/794,246

(22) Filed: Jun. 4, 2010

(65) Prior Publication Data

US 2010/0236046 A1 Sep. 23, 2010

Related U.S. Application Data

(63) Continuation of application No. PCT/EP2008/066676, filed on Dec. 3, 2008, which is a continuation of application No. PCT/EP2007/063330, filed on Dec. 5, 2007.

(30) Foreign Application Priority Data

Dec. 5, 2007 (CN) .......................... 2007 1 0196589

(51) Int. Cl.
*B21D 39/00* (2006.01)
*B23P 19/04* (2006.01)

(52) U.S. Cl.
USPC ................................. 29/429; 29/430; 29/791

(58) Field of Classification Search
USPC ..................... 29/429, 430, 771, 783, 791, 799
See application file for complete search history.

(56) References Cited

U.S. PATENT DOCUMENTS

| | | | | |
|---|---|---|---|---|
| 4,703,558 A | * | 11/1987 | Makinen | 29/784 |
| 4,722,653 A | * | 2/1988 | Williams et al. | 414/222.13 |
| 4,783,904 A | * | 11/1988 | Kimura | 29/786 |
| 5,125,149 A | * | 6/1992 | Inaba et al. | 29/430 |
| 6,256,868 B1 | * | 7/2001 | Sugito et al. | 29/711 |
| 6,519,837 B1 | * | 2/2003 | Ichikawa et al. | 29/720 |
| 6,804,880 B2 | | 10/2004 | Yamamoto | |
| 7,861,392 B2 | * | 1/2011 | Hibbler et al. | 29/429 |
| 2002/0157241 A1 | * | 10/2002 | Yamamoto | 29/705 |

FOREIGN PATENT DOCUMENTS

| | | | |
|---|---|---|---|
| DE | 4016033 A1 | 11/1991 | |
| DE | 4320704 C1 | 7/1994 | |
| EP | 0174545 A1 | 3/1986 | |
| EP | 0737543 A2 | 10/1996 | |
| JP | 07065652 A * | 3/1995 | ............ H01B 13/00 |
| JP | 08185218 A * | 7/1996 | |

OTHER PUBLICATIONS

International Search Report and Written Opinion of the International Searching Authority; PCT/EP2008/066676; Mar. 19, 2009; 10 pages.
Office Action From State Intellectual Property Office of People's Republic of China; Application No. CN 200880119022.2; Issued: Aug. 3, 2011; 7 pages.

* cited by examiner

*Primary Examiner* — Jermie Cozart
(74) *Attorney, Agent, or Firm* — St. Onge Steward Johnston & Reens LLC

(57) ABSTRACT

A production line for manipulating objects is provided. The production line has working stations for performing consecutive working steps on the objects by a stationary operator. At least one working station is arranged to be operated by a stationary operator that is a human and at least one working station is operated by a stationary operator that is a robot. The at least one working station being arranged for a stationary operator that is a human and the at least one working station being operated by a stationary operator that is a robot are arranged such that transfer of objects from one working station to the other working station is performed by one or both of the stationary operators. The robot has at least two arms. A method for operating a production line applying a corresponding concept is also provided.

11 Claims, 1 Drawing Sheet

PRODUCTION LINE AND METHOD FOR OPERATING SUCH

CROSS-REFERENCE TO RELATED APPLICATIONS

The present application is a continuation of pending International patent application PCT/EP2008/066676 filed on Dec. 3, 2008 which designates the United States and claims priority from Chinese patent application 200710196589.7 filed on Dec. 5, 2007. The present application is also a continuation of International patent application PCT/EP2007/063330 filed on Dec. 5, 2007. The content of all prior applications is incorporated herein by reference.

FIELD OF THE INVENTION

The present invention in a first aspect relates to a production line for manipulating objects including a plurality of working stations arranged one after another for performing consecutive working steps on the objects, each working station being arranged for at least one working step by a stationary operator, and at least one working station being arranged for a stationary operator that is a human and at least one working station having a stationary operator that is a robot.

In a second aspect, the invention relates to a method for operating a production line including a plurality of working stations arranged one after another where consecutive working steps are performed on objects where at least one working step is performed at each working station, and wherein at least one working step is performed by a human and at least one working step is performed by a robot.

BACKGROUND OF THE INVENTION

Frequently the production of items that require a plurality of working steps for their manufacture is carried out on a specially designed production line, where the various working steps are performed at consecutive working stations in a prescribed order. The working steps might be machining the object, inspecting the object, assembling additional components to the object etc. The arrangement of the production line of this kind is particularly useful when the manufacturing process is work intensive and includes a variety of working steps of various kinds. A typical example where such a production line is useful and frequently applied is for assembling, in particular assembling electronic items. Long ago production lines was operated by humans, with one person at each working station performing an isolated working step and then passing the object to the neighbouring person for the next working step, usually via an intermediate storage reachable by both persons. Such manually operated production lines are still common in countries where labour costs are low.

Due to increased labour costs, in particular in industrialized countries it has for many decades been a development to replace manually operated production lines with lines operated by industrial robots.

Traditional robot automation in a production line, however face various problems. It is inflexible and takes a long time to engineer. Time consuming activities include designing safety equipment, such as fences and emergency step chains, fixtures for accurate positioning and feeding solutions to get parts in and out of the robot cells, such as conveyors and feeders.

There exist various examples of production lines having working stations operated by humans as well as working stations operated by robots.

DE 43 20 704 discloses a production line with three consecutive cells, of which two are manually operated and one automatized cell. The objects are moved from one working station to the next by rotating working tables.

In the device of EP 737 543 all working stations along the production line are automatized. The stations 51-59 are called mounting machines. Then there is a plurality of intermediate satellite chargers 61-68. Each of these chargers is manually charged (see FIG. 2). However, the part of each satellite charger that constitutes a working station in the production line does not involve manual operation. Therefore the production line as such can be considered to contain only automatized working stations. Furthermore it is not mentioned that the working stations are arranged for robot operation. Finally the movement of the objects is not carried out by the stationary operators but is performed by a transport band.

Also in US 2002/15 7241 the objects are transported by means of a conveyer and not by the stationary operators. The working stations are not arranged such that the stationary operators can move the objects from one working station to the next. In particular the manually operated working station is located far away from the robot operated working stations.

In EP 174 545 the objects are not transported by the stationary operators, but by an endless conveyer as in L1 of FIG. 10 or by an alternative charger as in L2 of FIG. 10). Further it is not mentioned that robots are engaged and there is no mixing between manual and automatized working stations. In L1 all working stations are automatized, whereas in L2 all working stations are manual.

Where human and robots are mixed in a production line they are arranged separated a large distance from each other according to prior art. See for example US 2002/157241 mentioned above. This is due to safety reasons. If a robot and a human work so close to each other that they are within reach of each other there is a risk that the human might be injured by the robot. However the localization of the robots and the humans separated far from each other entails drawbacks, such as that a large area is occupied by the production line and that some kind of conveyer means is required.

The object of the present invention is to provide a production line where humans and robots are mixed, has a high degree of safety and solves the problems related to known mixed production lines.

SUMMARY OF THE INVENTION

This object is according to the first aspect of the invention attained in that a production line of the kind initially defined includes the specific features that a working station arranged to be operated by a human and a working station operated by a robot are sufficient close to each other for allowing the human and/or the robot to move objects from and/or to the other working station, and in that the robot has at least two arms.

By mixing robots and humans as operators for the production line the above described activities that are related to a production line solely operated by robots is to large extent reduced. Due to the close localization of a working station operated by a human and by a robot, respectively the interaction between the robots and the humans facilitate the transfer of the objects from one working station to the other and greatly reduce the engineering required to achieve this. Further, each working station can be optimized in that operations suitable for automation are performed by robots and those suitable to be carried out manually are performed by humans. Very important is that the robot has at least two arms. The multiple arm arrangement allows the robot to operate with a significant lower power on each arm in comparison with a single arm robot working at the same speed. The reason to that is that a multiple arm robot can make moves in parallel affording a much lower speed and kinetic energy build up to complete the same task as a single arm, provided of course that the operation task, e.g. assembly consists of several operations that can be parallelized.

A single arm robot will have to do two consecutive picks whilst the dual arm robot can pick two components in parallel. This can be illustrated by a typical example. Assuming a robot arm mass of 1.9 kg, viewed as equivalent moving point mass, a component mass of 0.1 kg, a pick delay of 0.1 s, i.e. the time from robot in position until the component is properly grasped and a total operation time of 1 s, which is the total time that the robot has to complete the two picks.

The required maximum power calculated for a single arm robot will be 758 W, whereas the required maximum power for a dual arm robot can be calculated to 80 W for each arm, representing a total of 160 W. The power for each arm thus differs by a factor of almost 10. This has a very large impact on safety and is a crucial aspect for allowing human and robots to work close to each other. This effect will be even more pronounced if more than two arms are used to perform tasks in parallel.

In relation to a production line operated solely by humans the present invention leads to much lower labour costs.

The result thus is a production line that is more cost effective than traditional production lines and which offers a high degree of safety, reliability and flexibility.

According to a preferred embodiment the invented production line is an assembly line, where at least one of the working stations is arranged for adding a component to each object.

Assembling is a working process that often requires a lot of consecutive steps to be performed, where each step frequently includes precise manipulating of various complexities. The invented production line therefore is of particular interest in such application because its advantages are here highly exploited. The invention therefore offers great benefits in a field like assembling electronic items.

Furthermore assembling is a kind of operation, where parallel operations are at hand and where a multiple arm robot thus is particularly useful considering the aspect of reducing the required arm power and the increased safety thereby attained.

In an assembly application of the invented production line normally more than one, typically the majority or even all working stations are arranged for adding a component or a plurality of components to each object.

According to a further preferred embodiment each robot arm has seven or more degrees of freedom (DOF).

The benefit of using seven DOF arms, which preferably are humanoid type arms, is that all robot arms in the dual arm robot can completely remain within the robot working station at all times by means of appropriate positioning of the robot elbows. This further increases the safety when a human and a robot work close to each other, and increases the compactness of the robot installation.

According to a further preferred embodiment the robot arms at least partly are covered by a soft padding. The soft padding is of a shock-absorbing material such as foamed rubber or the like.

Although the low power of the arm leads to a reduced risk for injure should a collision occur between the arm and a human, the soft padding will further reduce that risk.

According to a further preferred embodiment each arm is driven at a power that is less than 80 W.

As described above the power requirement of a multiple arm robot is much lower than that of a single arm robot when performing the same task. By this embodiment this fact is utilized for designing the robot for a very low power in order to take advantage of the increased safety gained therethrough.

According to a further preferred embodiment at least one of the working stations is arranged to be operated either by a robot or by a human.

Thereby a high degree of flexibility is attained.

According to a further preferred embodiment the working range of at least one robot corresponds to the working range a human would reach if located at the location of the robot.

This represents a further step regarding designing the robot such that it imitates a human. Also this embodiment therefore facilitates cooperation with a neighbouring human and also provides higher flexibility regarding the possibility to use either a human or a robot at the working station in question.

According to a further preferred embodiment a working station equipped with a robot includes at least one component storage and at least one fixture, the component storage and the fixture being arranged such that they would be usable by a human if located at the location of the robot.

Thereby the working station is further adapted to be operated either by a human or a robot and therefore further contributes to the flexibility of the production line, in particular for assembling applications.

The above mentioned preferred embodiments of the invented production line are specified in the claims. It is to be noted that further preferred embodiments of course can be realized by any possible combination of the preferred embodiments mentioned above.

In the second aspect of the invention the object has been attained in that a method of the initially defined kind includes the specific measures that the human and the robot operate in working stations sufficient close to each other for allowing the human and/or the robot to move objects from and/or to the other working station and in that the operation of the robot is performed by two robot arms.

According to a preferred embodiment of the invented method it includes assembling work, where the working step at least one of the working stations includes adding a component to the object.

According to a further preferred embodiment the products are temporarily stored between neighbouring working station and the operator, whether a robot or a human, at both neighbouring working stations drops or picks up respectively a temporarily stored object.

According to a further preferred embodiment the working stations are controlled regarding safety such that contact between a robot and a human is prevented or such that contact between a robot and a human restricts the action of the robot.

The above described preferred embodiments of the invented method are specified in the claims.

The invented method and the preferred embodiments thereof have advantages that are similar to those gained by the invented production line and the preferred embodiments thereof and which have been described above.

The invention will be further explained by the following detailed description of example thereof with reference to the accompanying drawings.

BRIEF DESCRIPTION OF THE DRAWINGS

The FIGURE schematically illustrates a production line according to an example of the invention in a view from above.

DETAILED DESCRIPTION OF THE INVENTION

Figure 1:
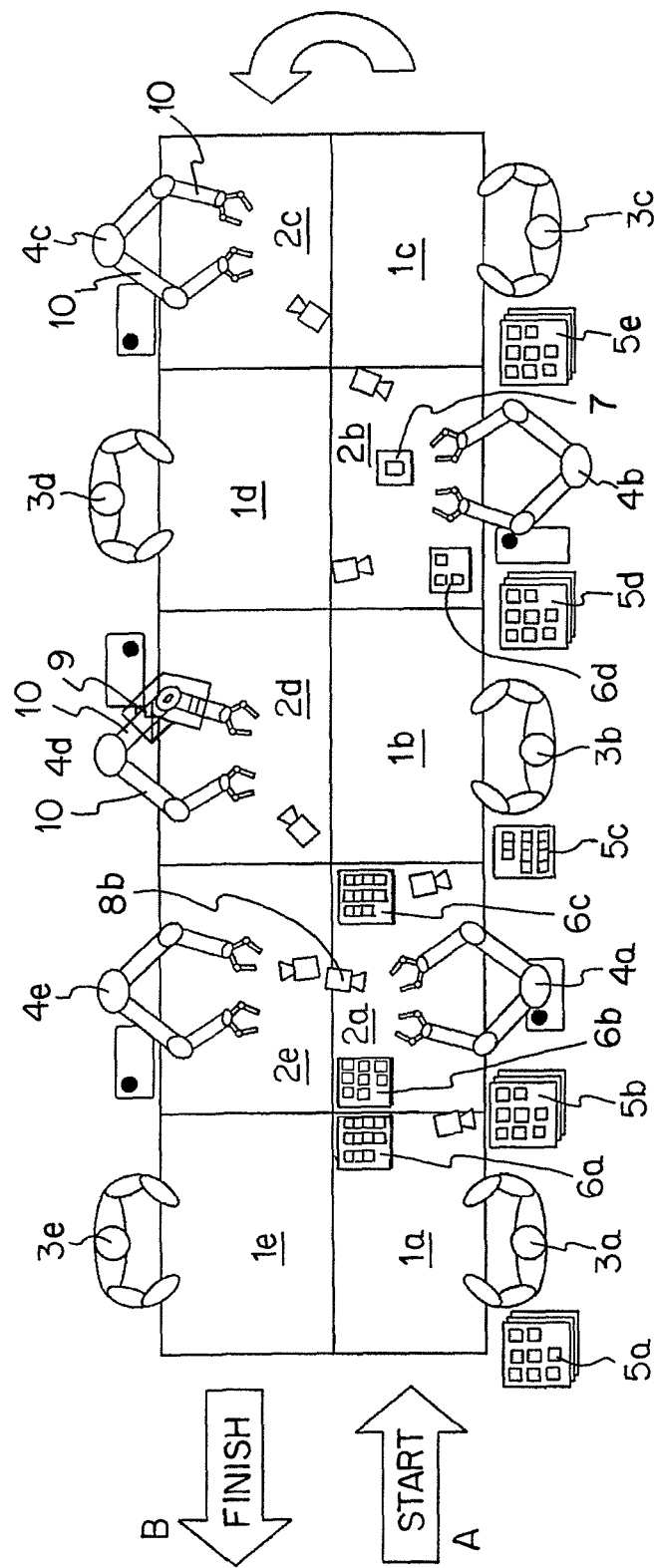

In the FIGURE a production line according to an example of the invention is schematically illustrated in a view from above. In this example the production line consist of ten working stations 1a-e, 2a-e, arranged in two parallel lines. Each working station is operated either by a human 3a-e such as in working stations 1a-e or by a robot 4a-e such as in working stations 2a-e.

Objects to be manipulated by the operators, i.e. the human and the robots, reach the production line at arrow A. The objects leave the production line at arrow B. The objects leave the production line either as finished products or as semi-manufactured articles for transport for further operation within the plant or elsewhere.

Incoming objects are temporarily stored in a first intermediate storage 5a. In this example the first working station 1a is operated by a human 3a. The working step in this first working station might for example be a first assembling operation, where a component from a component storage 6a is added to the object. The human thus picks up one object from the first intermediate storage 5a, picks up one or more components from the component storage 6a and mounts the component to the object. When this is done he puts the object with the mounted components into the second intermediate storage 5b, and then repeats the cycle with a next object.

The robot 4a in the second working station 2a picks up the object from the second intermediate storage 5b for performing the working step or working steps in the second working station 2a. In the example the working station has two component storages 6b, 6c for two kinds of components. The robot 4a at this working station mounts one component from component storage 6b and one component from component storage 6c to the object picked up from the intermediate storage 5b. When done this the robot 4a drops the object in a third intermediate storage 5c and repeats the cycle on a new object from intermediate storage 5b.

The objects are then picked up by the person 3b at the third working station 1b for performing the working steps related to this working station and so on.

Each working station might have a working step that is unique for that working station. Some working stations might have quite similar working steps. All working steps might be adding a component to the product when it is a pure assembly line. Some working stations as for example working station 1b can be arranged solely for controlling and testing the objects. Other working stations might include machining work.

Each robot in the illustrated example has two arms 10.

Although all robots 4a-e in the FIGURE are of the dual arm type, it is however not excluded that a single arm robot can be used at one or more working stations.

In working station 4b there is provided a fixture 7 for assisting in the working step performed in this working station.

The production line can be such that some or all of the robots 4a-e are permanently mounted at their respective station. In many cases it is however preferred to arrange the robot easily movable so that the robot can be replaced by a human or vice versa in order to achieve more flexibility.

As can be understood from the FIGURE the working ranges of a robot and a neighbouring human overlap each other. For example both the human 3a and the robot 4a reach the intermediate storage 5b. This entails a risk for injury to the human.

The robot arms can be embedded in soft padding. The robot 4d is provided with such padding 9 on one of its arms.

The robots preferably works through vision guided positioning whereby fixtures can be eliminated.

Further measures that are contemplated for increasing the safety are mechanical robot range limits, software robot limits, soft robot padding, and robot drive system energy and speed limitation.

In order to limit the power on each arm, e.g. at 80 W, the driving system of the arm has a fuse calibrated for a maximum power of 80 W in total for the motors of the arm. Alternatively, the software of the robot controller can be arranged to limit the power of the arm accordingly.

What is claimed is:

1. A production line for manipulating objects comprising:
a plurality of working stations arranged one after another for performing consecutive working steps on the objects, each working station being arranged for at least one working step to be performed by a stationary operator,
wherein at least one working station is arranged for a stationary operator that is a human and at least one working station is arranged for a stationary operator that is a robot,
wherein said at least one working station for a stationary operator that is a human and said at least one working station for a stationary operator that is a robot are arranged such that transfer of objects from one working station to the other working station is performed by one or both of said stationary operators, wherein the working range of the stationary operator that is a robot in one working station at least partly overlaps the working range of the stationary operator that is a human in a neighboring working station, and
wherein the stationary operator that is a robot has at least two arms.

2. The production line of claim 1, wherein the production line is an assembly line and wherein at least one of the working stations is arranged for adding at least one component to each object.

3. The production line of claim 1, wherein each robot arm has at least seven degrees of freedom.

4. The production line of claim 1, wherein the robot arms are at least partly covered by a soft padding.

5. The production line of claim 1, wherein each robot arm in the robot having at least two arms is driven at a power that is less than 80 W.

6. The production line of claim 1, wherein at least one of the working stations is arranged to be operated either by a robot or by a human.

7. The production line of claim 1, wherein the working range of at least one robot corresponds to the working range a human would reach if located at the location of the robot.

8. The production line of claim 7, wherein a working station equipped with a robot includes at least one component storage and at least one fixture being arranged such that the at least one component storage and the at least one fixture would be usable by a human if located at the location of the robot.

9. A method for operating a production line, the method comprising:
providing a plurality of working stations arranged one after another for performing consecutive working steps on objects, each working stations being arranged for at least one working step to be performed by an operator; and
performing consecutive working steps on the objects, where at least one working step is performed at each working station, and where the working step in at least one working station is performed by an operator being a human and the working step in at least one working station is performed by an operator being a robot, wherein the working stations are arranged such that the working range of the operator that is a robot in one working station at least partly overlaps the working range of the operator that is a human in a neighboring working station, wherein the transfer of objects from one working station where the working step is performed by a human to the other working station where the working step is performed by a robot is performed by one or both of said human and said robot, and wherein operations performed by the robot are performed by at least two robot arms.

10. The method of claim 9, wherein the method includes assembling work where the working step of at least one of the working stations includes adding a component to the object.

11. The method of claim 9, wherein the objects are temporarily stored between neighboring working stations and that an operator, whether a robot or a human, at both neighboring working stations drops or picks up respectively a temporarily stored object.

* * * * *